United States Patent
Yu et al.

(10) Patent No.: US 8,691,706 B2
(45) Date of Patent: Apr. 8, 2014

(54) REDUCING SUBSTRATE WARPAGE IN SEMICONDUCTOR PROCESSING

(75) Inventors: Chen-Hua Yu, Hsin-Chu (TW); Wen-Chih Chiou, Miaoli (TW); Fang Wen Tsai, Hsin-Chu (TW); Kuang-Wei Cheng, Hsin-Chu (TW); Jiann Sheng Chang, Hsin-Chu (TW); Yi Chou Lai, Taichung (TW); Jiung Wu, Kueishan Shiang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/349,323

(22) Filed: Jan. 12, 2012

(65) Prior Publication Data
US 2013/0183831 A1    Jul. 18, 2013

(51) Int. Cl.
*H01L 21/02*    (2006.01)

(52) U.S. Cl.
USPC ....... 438/758; 257/E21.17; 438/761; 438/763

(58) Field of Classification Search
USPC ................... 257/E21.17; 438/758, 761, 763
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |

(Continued)

*Primary Examiner* — Asok K Sarkar
(74) *Attorney, Agent, or Firm* — Slater & Matsil, L.L.P.

(57) ABSTRACT

System and method for reducing substrate warpage in a thermal process. An embodiment comprises pre-heating a substrate in a loadlock chamber before performing the thermal process of the substrate. After the thermal process, the substrate is cooled down in a loadlock chamber. The pre-heat and cool-down process reduces the warpage of the substrate caused by the differences in coefficients of thermal expansion (CTEs) of the materials that make up the substrate.

16 Claims, 2 Drawing Sheets

(56) References Cited

U.S. PATENT DOCUMENTS

| | | |
|---|---|---|
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2006/0156979 A1* | 7/2006 | Thakur et al. ............... 118/715 |
| 2007/0130738 A1* | 6/2007 | Ashizawa .................. 29/25.01 |
| 2011/0244617 A1* | 10/2011 | Su .............................. 438/46 |

\* cited by examiner

REDUCING SUBSTRATE WARPAGE IN SEMICONDUCTOR PROCESSING

BACKGROUND

Generally, semiconductor chips used in electronic devices comprise a semiconductor substrate and a packaging substrate for structural support. However, the packaging substrate is typically attached to the semiconductor substrate towards the end of processing. Therefore, the semiconductor substrate is often attached to a carrier for structural support during processing. The semiconductor substrate and the carrier may undergo rapid changes in temperature during the formation of semiconductor chips.

The semiconductor substrate and the carrier, however, frequently exhibit different coefficients of thermal expansion. Thus, as the semiconductor substrate and carrier are heated during processing, such as a chemical vapor deposition (CVD) process, the carrier expands at a different rate than the silicon. This difference in the expansion may cause the silicon and carrier to warp. This warpage not only may cause the silicon to crack, but may also reduce the usable portion of the semiconductor substrate due to the unevenness of the processes.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
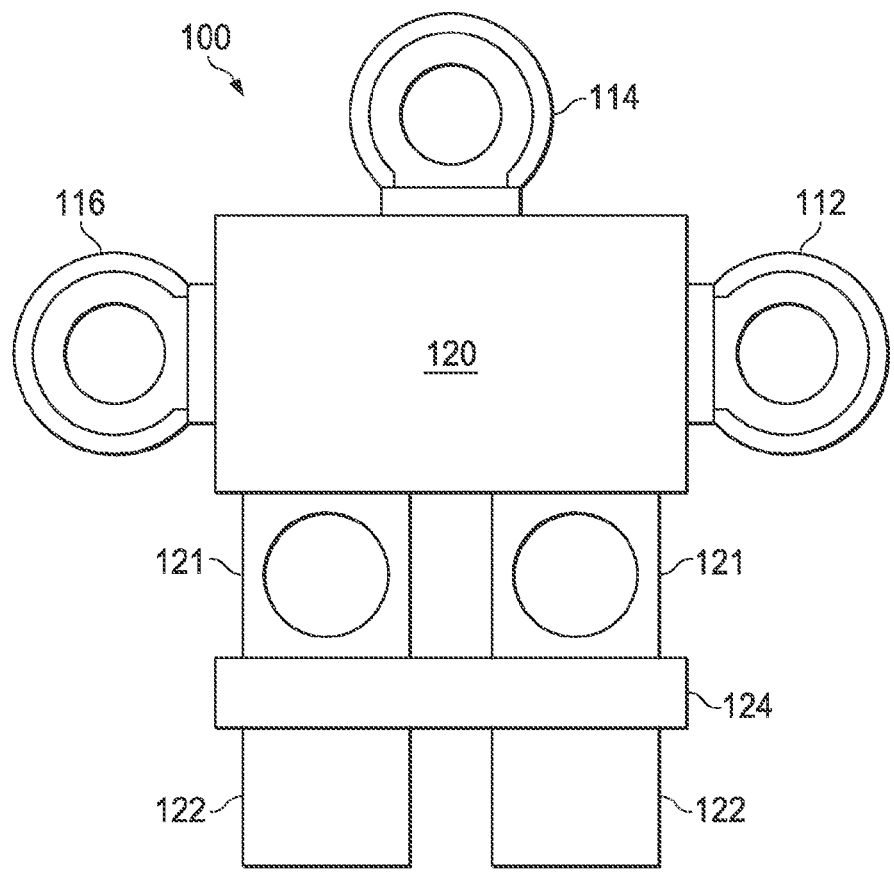
FIG. 1 is a schematic of a process tool in accordance with an embodiment.

This disclosure provides methods of performing a thermal process on a substrate while reducing wafer warpage. The method can be used to perform, for example, a chemical vapor deposition (CVD), a plasma-enhanced chemical vapor deposition (PECVD), annealing, metallization, and/or other processes performed at a high temperature. The disclosure also provides an embodiment of a loadlock chamber to perform the aforementioned methods. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 schematically illustrates a process tool 100 in accordance with an embodiment. The process tool 100 includes a first process chamber 112, a second process chamber 114, and a third process chamber 116 interconnected via a buffer chamber 120. Connected to the buffer chamber 120 are one or more loadlock chambers 121. The buffer chamber 120 and the one or more loadlock chambers 121 permit transferring one or more workpieces between the first process chamber 112, the second process chamber 114, and the third process chamber 116 without breaking vacuum between processes or chambers.

The process tool 100 may also include a transfer module 124 and load ports 122. The load ports 122, the transfer module 124, and the loadlock chambers 121 allow workpieces to be loaded and unloaded without exposing the buffer chamber 120, the first process chamber 112, the second process chamber 114, and the third process chamber 116 to air. The pressure of the load ports 122 is usually at about 1 atm (same as the fab environment), whereas that of the buffer chamber 120 may be much lower, typically under vacuum, e.g., less than about 10 Torr.

In operation, workpieces are transferred into and out of the process tool 100, either individually or in batches, via the load ports 122. The workpieces are transferred from the load ports 122 to the loadlock chamber 121 via the transfer module 124. Once transferred into the loadlock chambers 121, the workpieces are isolated from the ambient environment. Typically, an inert gas such as nitrogen is purged through the loadlock chamber 121, which is pumped down to a low pressure, if not vacuum, typically ranging from 200 to 1000 Pa, to remove any air from the atmosphere. The workpieces are transferred from the loadlock chamber 121 to one or more of the first process chamber 112, the second process chamber 114, and the third process chamber 116, which may also be pumped down to a similar pressure to be in equilibrium with the pressure of the loadlock chambers 121, via the buffer chamber 120.

The one or more workpieces may be transferred from one or more of the loadlock chambers 121 into a processing chamber, e.g., the first process chamber 112, the second process chamber 114, and the third process chamber 116, using a belt, robotic arm, or other transfer mechanism (not shown). The processing chambers may be equipped with heating elements, gas flow orifices, radio frequency coils, and other equipment (not shown) necessary to affect the desired process. Each of the processing chambers may be configured for the same process or different processes as desired.

In an embodiment, the loadlock chamber 121 and/or one or more of the process chambers 112, 114, and 116 are configured to pre-heat a workpiece. For example, in an embodiment in which through vias are utilized, it may be desirable to perform processing on the backside of the substrate, such as grinding and depositing films. In these embodiments, the substrate may be attached to a carrier to provide structural support during processing. The workpiece (e.g., the substrate and the carrier) may be loaded into the load port 122, and transferred into the loadlock chamber 121 by way of the transfer module 124. In this embodiment, the loadlock chamber 121 is heated to a temperature between about 50° C. and about 150° C., thereby pre-heating the workpiece. After the workpiece is pre-heated, it is then transferred to one of the process chambers 112, 114, or 116 for further processing. The process chamber may be heated, for example, to a temperature between about 150° C. and about 500° C. for the CVD process. After the CVD process is complete, the workpiece may be transferred to another process chamber for further processing or may be transferred to either another process chamber or a loadlock chamber 121 to allow the workpiece to cool down more gradually. This cool down chamber is heated to a temperature between room temperature, e.g. about 25° C., and about 50° C. The workpiece is then transferred out through the transfer module 124 to the load port 122 for removal from the process tool 100.

In an embodiment, the workpiece is a semiconductor substrate. The semiconductor substrate may be a bulk silicon substrate, although it may include other semiconductor materials such as group III, group IV, and/or group V elements. In another embodiment, the workpiece is a semiconductor substrate on a carrier with a release layer between the semiconductor substrate and the carrier. The carrier may be a glass carrier, a ceramic carrier, or the like. The release layer may be formed of a polymer-based thermal release or thermosetting material, which can be removed to detach the semiconductor substrate from the carrier. In an embodiment, the release layer is formed of a polymer-based material such as epoxy, polyimide, ultraviolet (UV) light glue, or the like. The release layer may be applied as a liquid and cured. In alternative embodiments, the release layer is a laminate film that is laminated onto the carrier. In some embodiments, the workpiece includes passive and/or active devices, such as resistors and transistors. For example, the workpiece may be silicon substrate on a glass carrier with a release layer between made from epoxy. Silicon has a coefficient of thermal expansion (CTE) of approximately 2.0, the epoxy release layer has a CTE between approximately 50 and approximately 250, and the glass carrier has a CTE of between approximately 3.0 and approximately 3.5. If these materials were at room temperature and were then immediately placed in the process chamber at approximately 500° C. for the CVD process, the higher CTE of the glass carrier and the release layer may cause them to expand much faster the silicon substrate, thereby, causing the glass carrier and silicon substrate to crack and/or warp. The cracking of the silicon may cause device damage to active and passive devices that may be in and/or attached to the silicon substrate. By pre-heating the workpiece at a lower temperature before raising the temperature to the desired process temperature, the thermal expansion is slowed allowing the materials to expand together and reducing the warpage of the workpiece.

It should be noted that FIG. 1 illustrates process tool 100 having three process chambers for illustrative purposes only. Other embodiments may include fewer or more process chambers. Additionally, other embodiments may utilize some, all, or none of the process chambers given above as examples. Embodiments of the present disclosure may be utilized, for example, in any process tool or other processing equipment wherein it is desirable to, e.g. reduce the rate of thermal change on a workpiece during a thermal process.

Figure 2:
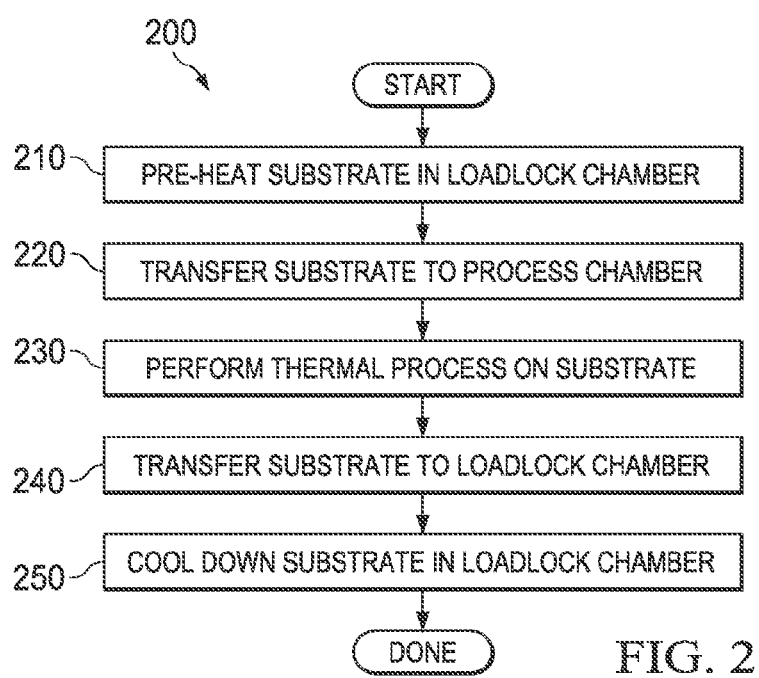
FIG. 2 is a flow chart of a method for performing a thermal process on a substrate according to an embodiment.

With reference now to FIG. 2, there is shown a flow chart of a method for performing a thermal process on a workpiece according to an embodiment. This method will discussed with reference to the process tool 100 in FIG. 1, but is not intended to be limited to process tool 100.

The method 200 begins with step 210 in which a workpiece is pre-heated in a loadlock chamber. In an embodiment, the workpiece may be placed into a loadlock chamber 121 that is at a temperature lower than the process temperature. The temperature in the loadlock chamber may then be gradually increased to a pre-heat temperature between about 50° C. and about 150° C. It should be noted that the temperature may be gradually increased, such as at a rate between about 30° C./min and about 120° C./min or the temperature in the loadlock chamber 121 may be increased to the pre-heat temperature as quickly as is possible.

In an embodiment, the workpiece may be placed in a loadlock chamber 121 with a heater that is already at the pre-heat temperature. The pre-heat temperature may be a temperature that is lower than the temperature used in the thermal process of step 230 (discussed below). For example, if the thermal process is a CVD process, the pre-heat temperature may be between about 50° C. and about 150° C. In some embodiments, the workpiece may be suspended from the heater by rods. (See FIG. 4 and the related text). The rods allow the workpiece to be more evenly heated than if placed in direct contact with the heater.

As discussed above, the pre-heating of the workpiece helps to prevent and/or reduce the warpage of the workpiece by easing the thermal expansion of the workpiece. In addition, the pre-heating of the workpiece may increase the overall throughput of the thermal process by decreasing the time required to heat the workpiece in the thermal process chamber itself. For example, in a CVD process, the workpiece may be pre-heated in a chamber that is at a temperature between about 50° C. and about 150° C. before entering the thermal process chamber that is at a temperature between about 150° C. and about 500° C. This pre-heating may decrease the amount of time the thermal process chamber may need to heat the workpiece before beginning the CVD process.

Next, as shown in step 220 of FIG. 2, the workpiece is transferred from the loadlock chamber to a process chamber. The transfer from loadlock chamber 121 to any one of the process chambers 112, 114, or 116 may be accomplished by using a belt, robotic arm, or other transfer mechanism (not shown).

After the workpiece is transferred to the process chamber, as shown in step 230 of FIG. 2, a thermal process is performed on the workpiece. The thermal process may be a CVD, PECVD, annealing, metallization, and/or any other process performed at a high temperature. In the CVD process example, the process chamber may be heated to a temperature between about 150° C. and about 500° C. before the workpiece is transferred into the process chamber. The CVD process will then be performed on the workpiece. In some embodiments, the workpiece may be suspended from the heater by rods. The rods allow the workpiece to be more evenly heated than if placed in direct contact with the heater.

After the thermal process is finished, the workpiece may be transferred another process chamber for further processing or to a loadlock chamber as shown in step 240 of FIG. 2. The transfer from the process chamber to the loadlock chamber 121 may be accomplished by using a belt, robotic arm, or other transfer mechanism (not shown).

After the workpiece is transferred to the loadlock chamber, the workpiece is cooled down in the loadlock chamber as shown in step 250 of FIG. 2. In an embodiment, the workpiece may be placed in the loadlock chamber 121 that is already at the cool-down temperature. The cool-down temperature may be a temperature that is lower than the temperature used in the thermal process of step 120 (discussed above). For example, if the thermal process is a CVD process, the cool-down temperature may be between about 25° C. and about 50° C. In some embodiments, the workpiece may be suspended from the heater by rods. The rods allow the workpiece to cool down more evenly than if placed in direct contact with the heater.

Figure 3:
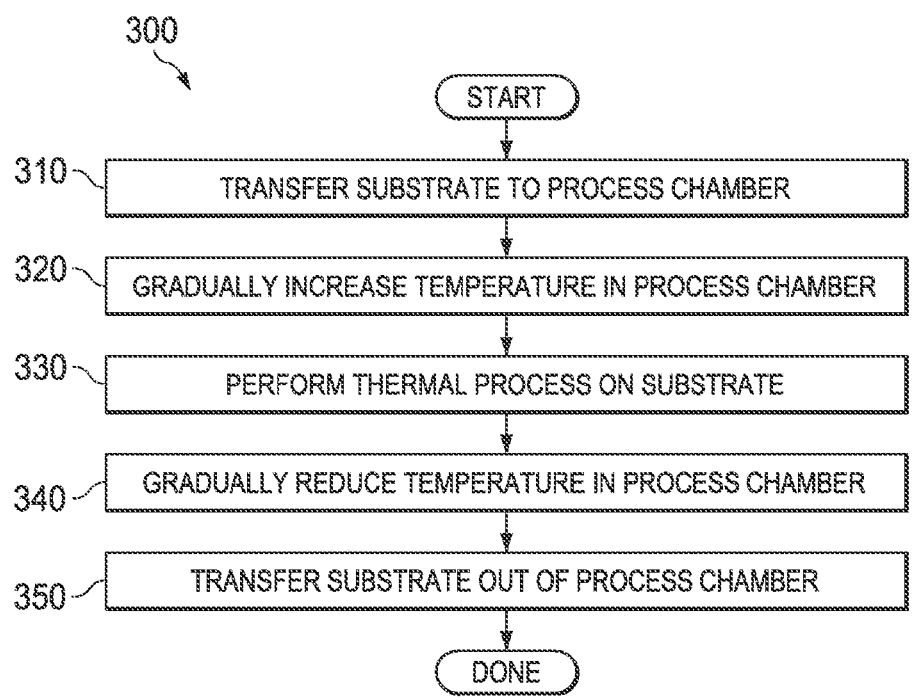
FIG. 3 is a flow chart of a method for performing a thermal process on a substrate according to another embodiment.

With reference to FIG. 3, there is shown a flow chart of a method for performing a thermal process on a workpiece according to another embodiment. This method will discussed with reference to the process tool 100 in FIG. 1, but is not intended to be limited to process tool 100.

The method 300 begins with step 310 in which the workpiece is transferred to a process chamber. The transfer to the process chambers may be accomplished by using a belt, robotic arm, or other transfer mechanism (not shown).

After the workpiece is transferred to the process chamber, the temperature of the process chamber is gradually increased as shown in step 320 of FIG. 3. In an embodiment, a process chamber may start at a lower temperature, e.g. a temperature that is near room temperature, and the chamber is then gradually heated with the workpiece in it. For example, the chamber temperature may start at a temperature between about 25° C. and about 50° C. and gradually be heated to a temperature between about 150° C. and about 500° C. at a rate between about 30° C./min and about 120° C./min. The gradual heating of the workpiece helps to reduce the warpage and cracking of the workpiece by easing the thermal expansion of the workpiece as discussed above in reference to FIG. 1.

Next, as shown in step 330, the thermal process is performed on the workpiece. The thermal process in step 330 is similar to the thermal process as previously discussed in reference to step 230 above.

After the thermal process is finished, the temperature in the process chamber is gradually reduced. In an embodiment, the temperature of the process chamber may start at a temperature that is near the temperature of the thermal process from step 330 of FIG. 3. The temperature in the process chamber may then be gradually reduced to a temperature between about 25° C. and about 50° C. at a rate between about −30° C./min and about −120° C./min. In some embodiments, the workpiece may be suspended above the heater by rods. The rods allow the workpiece to cool down more evenly than if placed in direct contact with the heater. The gradual cooling of the workpiece helps to reduce the warpage and cracking of the workpiece by easing the thermal contraction of the workpiece as discussed above in reference to FIG. 1.

After the temperature of the process chamber is gradually reduced, the workpiece is transferred out of process chamber as shown in step 350 of FIG. 3. The workpiece may be transferred to another process chamber for further processing or to the loadlock chamber 121. This transfer may be accomplished by using a belt, robotic arm, or other transfer mechanism (not shown).

Figure 4:
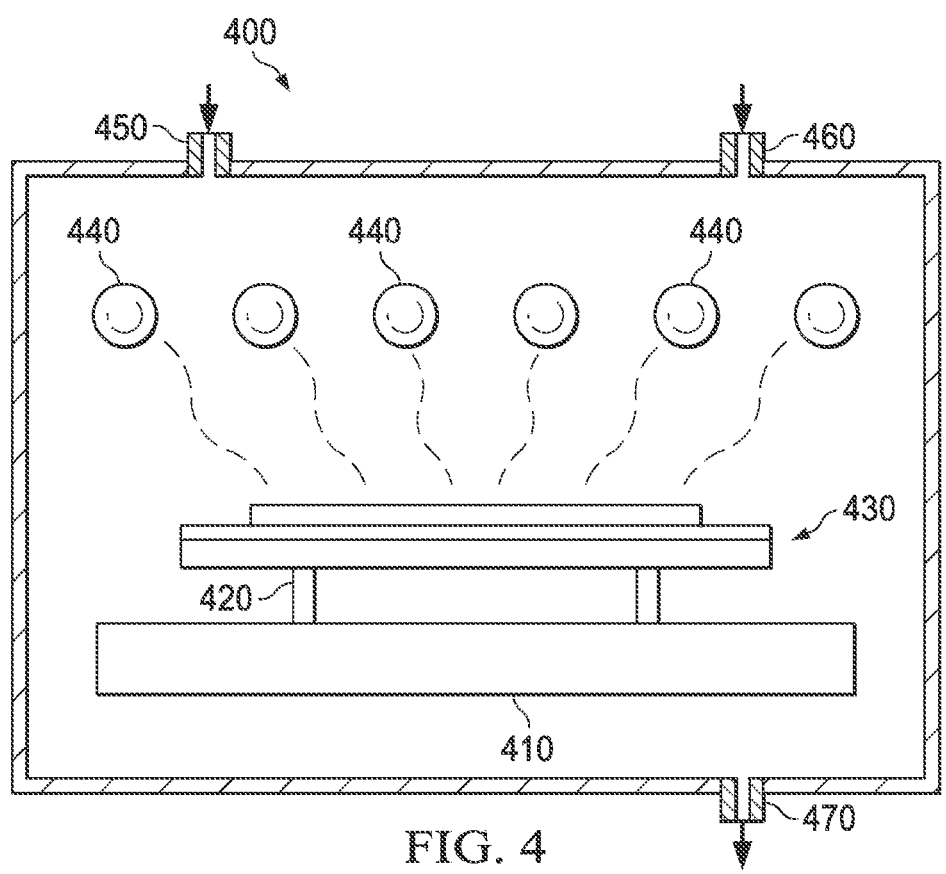
FIG. 4 is a cross-sectional view of a loadlock chamber according to an embodiment.

FIG. 4 illustrates a cross section view of a loadlock chamber 400, which may be used as one or more of the loadlock chambers 121 of FIG. 1, in accordance with an embodiment. One of ordinary skill in the art will realize that FIG. 4 schematically illustrates an embodiment of a loadlock chamber and an actual embodiment may take any shape or form.

Generally, the loadlock chamber 400 comprises an enclosed chamber having a top, a bottom, sidewalls, and one or more heating sources 410 and 440. A heating plate 410 may be positioned along the bottom of the chamber. The heating plate 410 controls the temperature in the loadlock chamber 400. The heating plate 410 may also include raised portions, such as a plurality of support rods 420 upon which a workpiece 430 may rest. In an embodiment, the workpiece 430 may comprise of a carrier 431, a release layer 432, and a substrate 433 (discussed above in reference to FIG. 1). The height of the support rods 420 may be adjusted to modify the heating rate needed for a particular application. For example, it has been found that the height of the support rods 420 may be reduced to shorten the period of time required to heat a workpiece to a specific temperature. Conversely, if the heights of the support rods 420 are increased, the workpiece may increase the time to heat the workpiece to a specific temperature but the workpiece will heat more evenly. In an embodiment, the height of the support rods 420 is between about 2 mm and about 12 mm. Other heights, however, may be used. It should also be noted that other shapes may be used. For example, the support rods 420 may be any shape and may comprise ridges or a spiral shape on the heating plate 220.

The loadlock chamber may 400 also includes a secondary heating source 440. The secondary heating source 440 may be aligned in the top half of the loadlock chamber 400 and in combination with the heating plate 410 helps to evenly heat the workpiece 430 from the top, sides, and bottom. The secondary heating source 440 may comprise of ultraviolet lamps, infrared lamps, microwave, and the like. The secondary heating source 440 and the heating plate 410 may cooperate to increase, decrease, or maintain a specific temperature in the loadlock chamber 400.

FIG. 4 also illustrates a first port 450 for inputting purge gases and a second port 470 for evacuating gases in accordance with an embodiment. The first port 450 and the second port 470 act together to create and maintain a gas atmosphere within the loadlock chamber 400. The purge gases may comprise argon, nitrogen, helium, and the like. In an embodiment, the first port 450 and second port 470 cooperate to maintain a specific pressure within the loadlock chamber 400. For example, the first port 450 and the second port 470 may be configured to maintain an atmospheric pressure within the loadlock chamber 400 from about 200 Pa to about 1000 Pa.

The loadlock chamber may also include a plasma source 460. The plasma source 460 may provide another heating source for the loadlock chamber 400. The plasma source 460 in combination with the heating plate 410 and the secondary heating source 440 helps to evenly heat the workpiece 430 from the top, sides, and bottom. The plasma source 460 may comprise nitrogen plasma, helium plasma, argon plasma, and the like.

It should be noted that FIG. 4 illustrates the loadlock chamber 400 having the heating plate 410 positioned along the bottom of the chamber, the secondary heating source 440 aligned along the top half of the chamber, and the plasma source 460 on the top of the chamber. Other embodiments may place these elements in other locations in the loadlock chamber 400. For example, the heating plate 410 may be in the top half of the loadlock chamber 400 and the secondary heating source 440 may be in the bottom half of the loadlock chamber 400, or the heating plate 410 and the secondary heating source 440 may both be in the top half or bottom half of the loadlock chamber 400. Additionally, the plasma source 460 may be located on the top, sides, or bottom of the loadlock chamber 400.

The heating plate 410, the secondary source 440, the plasma source 460, and the support rods 420 all help to gradually and evenly heat the workpiece on all sides. The gradual and even heating of the workpiece helps to reduce the warpage and cracking of the workpiece by easing the thermal expansion and contraction of the workpiece. As discussed above in reference to FIG. 1, the CTEs of the different materials that make up the workpiece may cause each of the materials to expand and/or contract at a different rate. This difference in the expansion and contraction rates may cause the workpiece to crack and warp, which reduces the usable area of the workpiece and may cause damage to devices in or attached to the workpiece.

Although the present embodiments and their advantages have been described in detail, it should be understood that various changes, substitutions and alterations can be made herein without departing from the spirit and scope of the disclosure as defined by the appended claims. For example it will be readily understood by those skilled in the art that many of the features, functions, processes, and materials described herein may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for semiconductor processing comprising:
heating a first loadlock chamber to a first temperature, the first loadlock chamber being interposed between an ambient environment and a buffer chamber;
after heating the first loadlock chamber to the first temperature, placing a substrate in the first loadlock chamber; and
performing a process on the substrate, wherein the process involves heating the substrate to a second temperature, the second temperature being greater than first temperature.

2. The method of claim 1 further comprising:
cooling down the substrate to a third temperature in a second loadlock chamber, the third temperature being less than the second temperature.

3. The method of claim 2, wherein the cooling down the substrate comprises placing the substrate into the second loadlock chamber, wherein the second loadlock chamber is pre-heated to the third temperature.

4. The method of claim 1, wherein the placing the substrate in the first loadlock chamber comprises placing the substrate on one or more raised support regions in the chamber.

5. The method of claim 1, wherein the placing the substrate in the chamber comprises:
placing the substrate in the first loadlock chamber, wherein the first loadlock chamber is at a temperature less than the first temperature; and
gradually increasing the temperature of the first loadlock chamber to a third temperature at a rate between 30° C./min and 120° C./min, the third temperature being less than the second temperature.

6. The method of claim 1, wherein the process is a chemical vapor deposition process.

7. A method for semiconductor processing comprising:
heating a first loadlock chamber to a first temperature;
during the heating the first loadlock chamber to the first temperature, transferring a substrate into the first loadlock chamber, the first loadlock chamber capable of being directly exposed to a room environment;
transferring the substrate to a process chamber; and
performing a process on the substrate at a second temperature, the second temperature being greater than the first temperature.

8. The method of claim 7 further comprising:
transferring the substrate to a second loadlock chamber; and
cooling down the substrate to a third temperature in the second loadlock chamber, the third temperature being less than the second temperature.

9. The method of claim 8, wherein the first loadlock chamber and the second loadlock chamber are a same chamber.

10. The method of claim 7, wherein the heating the first loadlock chamber comprises:
heating by a first heating source, the first heating source being above the substrate; and
heating by a second heating source, the second heating source being below the substrate.

11. The method of claim 7, further comprising supporting the substrate with one or more raised support regions within the first loadlock chamber.

12. The method of claim 7, wherein the process is a chemical vapor deposition process.

13. A method for semiconductor processing comprising:
heating a first loadlock chamber to a first temperature;
after heating the first loadlock chamber to the first temperature, transferring a substrate from a room environment directly into the first loadlock chamber;
transferring the substrate from the first loadlock chamber to a process chamber; and
performing a process on the substrate in the process chamber at a second temperature, the second temperature being greater than the first temperature.

14. The method of claim 13, wherein the transferring the substrate to the process chamber comprises:
transferring the substrate from the loadlock chamber to a buffer chamber; and
transferring the substrate from the buffer chamber to the process chamber.

15. The method of claim 13, wherein the heating the first loadlock chamber comprises heating the first loadlock chamber with at least two heating sources, at least one of the heating sources being below the substrate.

16. The method of claim 13 further comprising:
transferring the substrate to a second loadlock chamber; and
cooling down the substrate to a third temperature in the second loadlock chamber, the third temperature being less than the second temperature.

* * * * *